(12) United States Patent
Lablans

(10) Patent No.: US 7,782,089 B2
(45) Date of Patent: Aug. 24, 2010

(54) MULTI-STATE LATCHES FROM N-STATE REVERSIBLE INVERTERS

(75) Inventor: Peter Lablans, Morris Township, NJ (US)

(73) Assignee: Ternarylogic LLC, Morristown, NJ (US)

( * ) Notice: Subject to any disclaimer, the term of this patent is extended or adjusted under 35 U.S.C. 154(b) by 0 days.

(21) Appl. No.: 12/635,307

(22) Filed: Dec. 10, 2009

(65) Prior Publication Data

US 2010/0085802 A1   Apr. 8, 2010

Related U.S. Application Data

(63) Continuation of application No. 12/061,286, filed on Apr. 2, 2008, now Pat. No. 7,656,196.

(51) Int. Cl.
*H03K 19/00* (2006.01)
(52) U.S. Cl. .......................... 326/59; 326/46
(58) Field of Classification Search .............. 326/46, 326/56–60, 112
See application file for complete search history.

(56) References Cited

U.S. PATENT DOCUMENTS

| | | |
|---|---|---|
| 3,129,340 A | 4/1964 | Baskin |
| 3,176,154 A | 3/1965 | Salter |
| 3,207,922 A | 9/1965 | Groudis et al. |
| 3,671,763 A | 6/1972 | Maley et al. |
| 3,671,764 A | 6/1972 | Maley et al. |
| 3,909,634 A | 9/1975 | Maley et al. |
| 4,107,549 A | 8/1978 | Hussein |
| 4,158,891 A * | 6/1979 | Fisher ................... 365/222 |
| 4,378,595 A | 3/1983 | Current |
| 4,513,283 A | 4/1985 | Leininger |
| 4,808,854 A | 2/1989 | Reinagel |
| 5,122,688 A | 6/1992 | Grimes |
| 5,148,052 A | 9/1992 | Yellamilli |
| 5,281,805 A | 1/1994 | Sauer |
| 5,767,717 A | 6/1998 | Schorn et al. |
| 6,067,180 A | 5/2000 | Roberts |
| 6,133,754 A | 10/2000 | Olson |
| 6,191,977 B1 | 2/2001 | Lee |
| 6,300,809 B1 | 10/2001 | Gregor et al. |
| 6,731,140 B2 | 5/2004 | Masleid et al. |
| 7,218,144 B2 | 5/2007 | Lablans |
| 7,263,262 B1 | 8/2007 | Covey |
| 2002/0158663 A1 | 10/2002 | Shemesh |

OTHER PUBLICATIONS

Milan, Petrik "Design of Many-Valued Logical Circuits", *Czech Technical University*, Prague, Czech Republic, (Feb. 8, 2004).

(Continued)

*Primary Examiner*—Don P Le
(74) *Attorney, Agent, or Firm*—Diehl Servilla LLC

(57) ABSTRACT

N-valued re-circulating latches using n-valued reversible inverters with n>3 are disclosed. Latches using n-valued self-reversing inverters are provided; latches using n-valued universal inverters are provided; and latches using inverters which are not self-reversing or universal are also provided. A latch may use two individually controlled gates. It may also use one individually controlled gate. N-valued latches are provided wherein a state is represented by a signal being an independent instance of a physical phenomenon. A latch not using absence-of-signal as a state is also provided.

20 Claims, 12 Drawing Sheets

OTHER PUBLICATIONS

Ugur, Cilingiroglu et al., "Multiple-Valued Static CMOS Memory Cell", *IEEE Transactions on Circuits and Systems-II Analog and Digital Signal Processing*, vol. 48, No. 3, (Mar. 2001), 282-290.

Omid, Mirmotahari et al., "A Novel D-Latch in Multiple-Valued Semi-Floating-Gate Recharged Logic", *Proceedings of ISMVL '04*, 4 pages.

Hanyu, et al., "A Floating-Gate-Mos-Based Multiple-Valued Associative Memory", *Proc. IEEE International Symposium on Multiple-Valued Logic*, 21, (1991), 24-31.

Alexey Stakhov, "Brousentsov's Ternary Principle, Bergman's Number System and Ternary Mirror-symmetrical Arithmetic", *The Computer Journal*, vol. 45, No. 2, (2002), 221-236.

Inaba, et al., "Multi-Valued Flip-Flop with Neuron-CMOS NMIN Circuits", *IEEE, Proceedings of the 32nd International Symposium on Multiple-Valued Logic (ISMVL '02)*, 7 pages.

Masamichi, Akazawa et al., "Multiple-valued Inverter Using a Single-Electron-Tunneling Circuit", *IECE Trans. Electron.*, vol. E82-C, No. 9, (Sep. 1999), 1607-1614.

\* cited by examiner

MULTI-STATE LATCHES FROM N-STATE REVERSIBLE INVERTERS

STATEMENT OF RELATED CASES

This patent application is a continuation and claims the benefit of U.S. patent application Ser. No. 12/061,286 filed on Apr. 2, 2008, entitled Multi-State Latches From n-State Reversible Inverters, which is a continuation-in-part and claims the benefit of U.S. patent application Ser. No. 11/139,835, filed on May 27, 2005, entitled Multi-Valued Digital Information Retaining Elements and Memory Devices, now U.S. Pat. No. 7,397,690 issued on Jul. 8, 2008, all of which are incorporated herein by reference in their entirety.

BACKGROUND OF THE INVENTION

This invention relates to digital n-state memory latches. More specifically it relates to n-state memory latches comprising n-state reversible inverters.

Multi-valued or n-state digital memory elements can be applied in digital circuit applications where the temporary storage of n-state digital information is required.

There are known and different ways to retain binary digital information. There are known physical effects that put a material in one of two different physical states. A capacitor holding an electrical charge may represent a binary 1 state, while the capacitor without a certain electrical charge may represent a binary 0. Different magnetic states (such as applied in magnetic disk drives) are another example. Another example is the optical reflective state of a material such as applied in optical disks (such as CD-ROMs).

Other binary devices use logical effects. By applying binary logical functions in feedback configurations, the resulting (usually electronic) circuit retains information about its previous switching state or states. Binary flip-flops and latches are well known examples. The memory effect depends mainly on the applied logical functions.

One way to implement binary latches is by using inverters in feedback. These latches may be called re-circulating binary latches.

N-state or n-valued memory devices using two 2 input/single output n-state logic functions are disclosed by the inventor in U.S. patent application Ser. No. 11/139,835, filed on May 27, 2005.

An n-valued digit (with n an integer greater than 2) has inherently more information content than a binary digit. Accordingly, a memory device that can retain an n-valued digit retains more information than a binary memory device. Multi-valued sequential digital (memory) devices can also facilitate the usefulness of other multi-valued logic circuits.

An n-state or n-valued datum or symbol is a single element or signal representing one of n states. It is known that an n-state symbol can be represented by 2 or more lower valued symbols. However, an n-state or n-valued symbol herein is intended to mean a single symbol that is represented by a single signal and wherein a plurality of signals represent a plurality of symbols, unless explicitly identified as meaning something else. An n-state latch in general will mean herein to be a device that will store an n-state symbol in its n-state symbol form and not as a plurality of lower valued or lower state symbols.

In some situations, it may be beneficial to have n-state latches which can be implemented with n-state inverters, which may be easier to use than the two 2-input/single output n-state logic functions with feedback. N-state latches from n-state inverters using signals which are independent instances of a physical phenomenon are unknown.

Accordingly, new and improved devices and methods to realize n-state latches from n-state inverters are required. Latches with n-state inverters using signals which are independent instances of a physical phenomenon are also required.

SUMMARY OF THE INVENTION

In view of the more limited possibilities of the prior art in creating non-binary sequential devices, the current invention offers an improvement of the design and creation of n-valued devices including n-valued memory and sequential devices.

The general purpose of the present invention, which will be described subsequently in greater detail, is to provide methods of designing and testing of ternary, 4-valued and other multi-valued digital sequential devices as well as the devices themselves. Before explaining at least one embodiment of the invention in detail, it is to be understood that the invention is not limited in its application to the details of construction and to the arrangements of the components set forth in the following description or illustrated in the drawings. The invention is capable of other embodiments and of being practiced and carried out in various ways. The described information retaining devices are enabled by any switching mechanism that realizes the truth tables that are part of the invention. These switching mechanisms can be electronic, optical, mechanical, quantum-mechanical, molecular or of any other physical switching nature. Also, it is to be understood that the phraseology and terminology employed herein are for the purpose of the description and should not be regarded as limiting.

Multi-valued, n-state, multi-state and n-valued in the context of this application mean a number n, with n being an integer greater than two. N-valued logic functions are assumed to have two input values and one output value determined by a truth table, usually presented in an n×n matrix form, with input values shown in an additional row on top of the matrix and one column to the left of the matrix. N-state inverters are, in principle, single input/single output devices, unless stated otherwise. The truth table of an n-state inverter can be represented as a 1×n vector. An n-state signal can be represented and implemented in a plurality of p-state symbols with p<n. An n-state symbol, however, is a single symbol which can assume one of n states. An n-state symbol is represented by a single signal unless stated differently.

In accordance with an aspect of the present invention, an n-state re-circulating latch for storing an n-state symbol with n>3 is provided, comprising, an input enabled to receive a signal representing one of n states, an output enabled to provide a signal representing one of n states, a forward path between the input and the output and a feedback path different from the forward path between the output and the input, the forward path and feedback path being part of a loop, and at least two reversible n-state inverters in the loop.

In accordance with another aspect of the present invention, an n-state re-circulating latch for storing an n-state symbol with n>3 is provided, further comprising, at least two reversible n-state inverters in a loop establishing an identity inverter.

In accordance with a further aspect of the present invention, an n-state re-circulating latch for storing an n-state symbol with n>3 is provided, further comprising a first individually controlled n-state gate having an input enabled to receive a signal having one of n states, a control input enabled to receive a signal that can be in a first state or not a first state, and an output being connected to the input of the re-circulating latch enabled to provide a signal that represents the one of n states of the signal at the input of the gate, and a second individually controlled n-state gate being in the feedback path, having an input enabled to receive a signal having one of n states, a control input enabled to receive a signal that can be in a second state or not a second state, and an output enabled to provide a signal that represents the one of n states of the signal at the input of the gate.

In accordance with another aspect of the present invention, an n-state re-circulating latch for storing an n-state symbol with n>3 is provided, wherein n=$2^p$ with p>2.

In accordance with a further aspect of the present invention, an n-state re-circulating latch for storing an n-state symbol with n>3 is provided, wherein an n-valued signal is an independent instance of a physical phenomenon.

In accordance with another aspect of the present invention, an n-state re-circulating latch for storing an n-state symbol with n>3 is provided, wherein the phenomenon is light and an independent instance is determined by a wavelength.

In accordance with a further aspect of the present invention, an n-state re-circulating latch for storing an n-state symbol with n>3 is provided, wherein an n-state reversible inverter is a self-reversing inverter.

In accordance with another aspect of the present invention, an n-state re-circulating latch for storing an n-state symbol with n>3 is provided, wherein an n-state reversible inverter is a universal inverter.

In accordance with a further aspect of the present invention, an n-state re-circulating latch for storing an n-state symbol with n>3 is provided, further comprising at least 3 n-state reversible inverters.

In accordance with another aspect of the present invention, an n-state re-circulating latch for storing an n-state symbol with n>3 is provided, wherein not all inverters are standard n-state inverters.

In accordance with a further aspect of the present invention, an n-state re-circulating latch for storing an n-state symbol with n>3 is provided, wherein the control inputs of a first and a second individually controlled gate receive the same signal.

In accordance with another aspect of the present invention, an n-state latch for storing a signal representing one of n states is provided, comprising, n≧2, a circuit having an input enabled to receive a signal representing one of n states and an output enabled to provide a signal representing one of n states, the circuit having a loop including a forward path between the input and the output and a feedback path between the output and the input, at least two n-state reversible inverters being contained in the loop, and a signal at the input being an independent instance of a physical phenomenon, the signal representing one of n states.

In accordance with yet another aspect of the present invention, an n-state latch for storing a signal representing one of n states is provided, wherein absence of signal does not represent a state.

In accordance with yet another aspect of the present invention, an n-state latch for storing a signal representing one of n states is provided, wherein n>2.

In accordance with yet another aspect of the present invention, an n-state latch for storing a signal representing one of n states is provided, wherein at least one n-state reversible inverter is not a standard n-state inverter.

In accordance with yet another aspect of the present invention, an n-state latch for storing a signal representing one of n states is provided, wherein the latch is part of a device that processes digital symbols.

In accordance with a further aspect of the present invention, a latch is provided for storing an n-state symbol having one of n states with n≧2, comprising: an input enabled to receive a signal being an independent instance of a physical phenomenon and representing one of n states, an output enabled to provide a signal being an independent instance of a physical phenomenon and representing one of n states, at least two n-state reversible inverters, the latch being in a first condition when the input is provided with a signal not being absence of signal or absence of state and representing one of n states and the output providing a signal representing the state of the signal at the input, and the latch being in a second condition whenever the input is provided with a signal being absence of signal or absence of state and the output providing a signal equivalent to the signal of the output when the latch was in the first condition.

In accordance with another aspect of the present invention, a latch is provided for storing an n-state symbol having one of n states with n≧2, further comprising: at least two n-state inverters establishing identity.

In accordance with yet another aspect of the present invention, a latch is provided for storing an n-state symbol having one of n states with n≧2, wherein the latch is part of a computing device.

In accordance with yet another aspect of the present invention, a latch is provided for storing an n-state symbol having one of n states with n≧2, wherein the latch is part of a communication system.

BRIEF DESCRIPTION OF THE DRAWINGS

Various other objects, features and attendant advantages of the present invention will become fully appreciated as the same becomes better understood when considered in conjunction with the accompanying drawings, and wherein.

DETAILED DESCRIPTION OF THE INVENTION

In accordance with one aspect of the present invention, n-state inverters will be used to implement an n-state latch. A diagram of a 4-state inverter is provided in FIG. 1. The inverter 100 has an input 101 and an output 102. An n-state inverter transforms an inputted n-state signal, which can assume one of n states, into an outputted n-state signal at the output. A special class of inverters is formed by the reversible inverters. Two or more reversible n-state inverters which individually are not identity combined can be identity.

Figure 1:
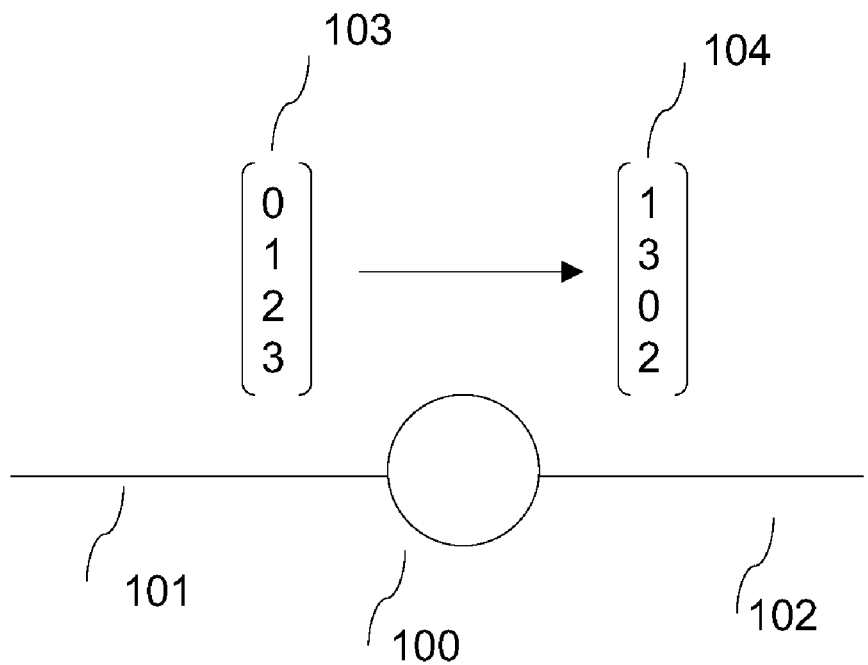
FIG. 1 is a diagram of an n-valued reversible inverter in accordance with an aspect of the present invention.

The transformation of states by an inverter in a 4-state example is shown in FIG. 1. The input states can assume state 0, 1, 2 and 3 as shown by the column vector 103. The output can assume, according to the column vector the states 1, 3, 0, and 2. The transformation that the inverter 100 performs is then [state 0→state 1]; [state 1→state 3]; [state 2→state 0]; and [state 3→state 2]. Herein, the convention will be that n possible states at an input will be presented as [0 1 2 3 . . . n−1]. That is: in an input vector position 0 has state 0, position 1 has state 1, . . . and position n−1 has state n−1. The output vector shows the result from the transformation by the inverter. Because an input vector is already determined as being [0 1 2 3 . . . n−1] one may thus represent an inverter by its output vector.

Accordingly, the inverter in FIG. 1 is [1 3 0 2]. The inverter that will reverse the inverter 100 is then [2 0 3 1]. This is merely an example. Other examples will be provided later. Inverters are explained in detail in patent application Ser. No. 10/935,960. It should be pointed out that in the literature for MVL each n-state logic has just one inverter which is defined as: y=(n−1)−x. Herein, n is the number of states, x is the original state and y is the inverted state. According, to this rule a 3-state logic has inverter [2 1 0]. A 4-state logic has inverter [3 2 1 0]. Such an n-state inverter may be called a standard n-state inverter. However, this inverter is just one of n! possible reversible inverters in an n-state logic.

For convenience for the designation of states numbers are used. This may lead to confusion as sometimes significance is attributed to a signal corresponding to a state. The most often occurring confusion is around the state 0, as sometimes it is assumed that a state 0 is equivalent to absence of signal. Such equivalence is not assumed herein automatically, though it is not excluded.

Figure 2:
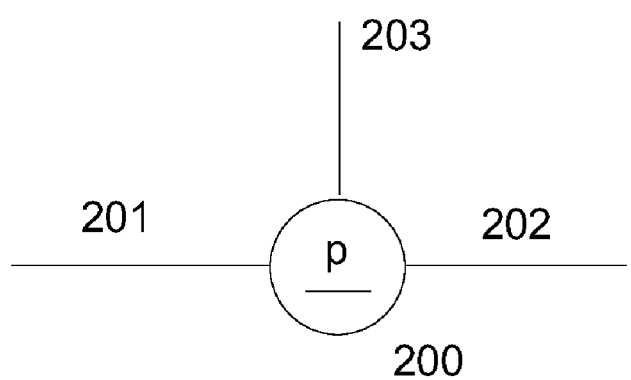
FIG. 2 is a diagram of an individually controlled gate in accordance with an aspect of the present invention.

Another n-state element that will be used is an n-state switch of which an example is shown in FIG. 2. The switch 200 has an input 201, an output 202 and a control input 203. The signals at the input and the output can assume one of n states. The signal at the control input must be able to assume at least one of 2 states and may assume one of n states. The circle 200 has inside a horizontal line with a p on top of it. The switch has the following functionality. A signal in a first of n states is provided at the input 201. When the control input 203 has the state p of n states then the output 202 provides a signal representing the state of the signal at the input 201. Whenever the state of the control input is not p, then the output 202 provides a signal representing absence of signal at the input 201.

Figure 3:
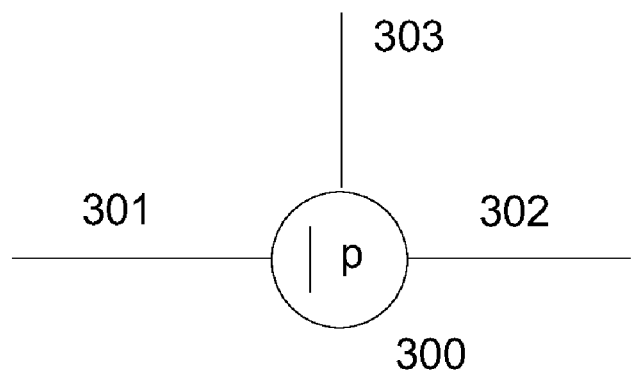
FIG. 3 is another diagram of an individually controlled gate in accordance with an aspect of the present invention.

FIG. 3 shows a different n-state switch 300. The circle has a vertical line, next to a p. When this switch has a signal in a certain state at the input 301, then the output 302 will generate a signal representing the state of the signal at the input when the control input 303 does not have the state p. When 303 has the state p, then the output will have a signal representing absence of signal at the input 301.

Figure 4:
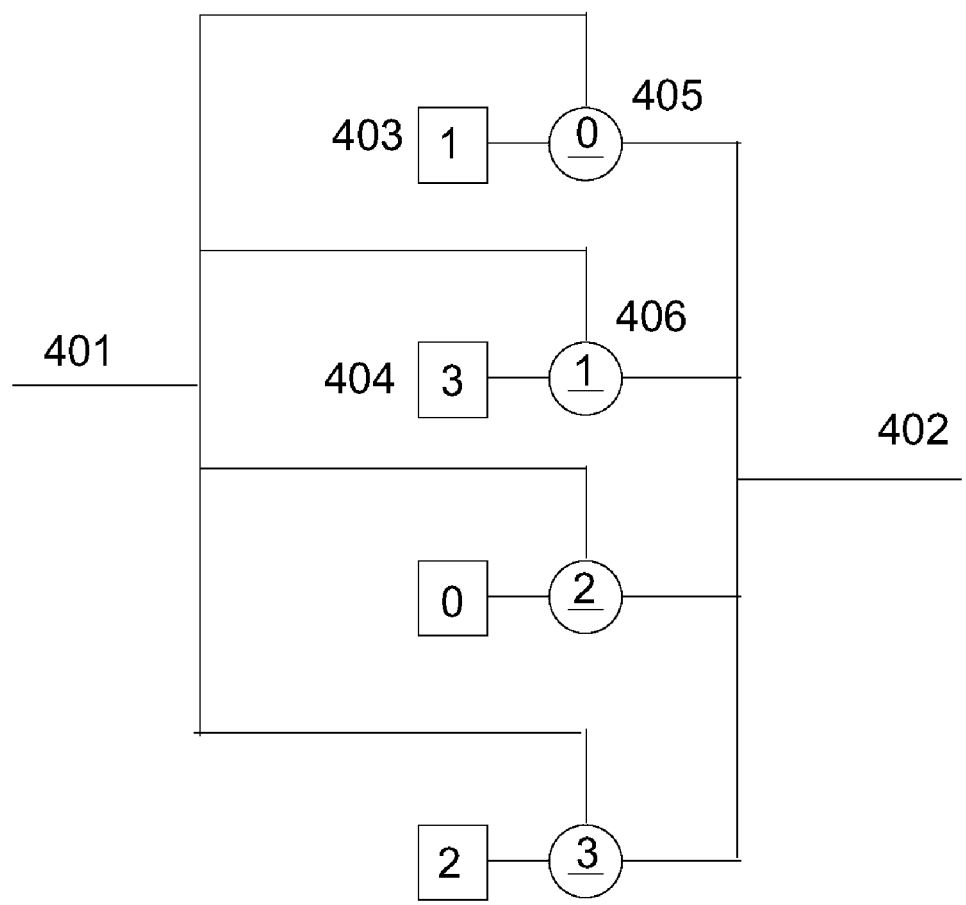
FIG. 4 is a diagram of a 4-valued reversible inverter in accordance with an aspect of the present invention.

FIG. 4 shows a diagram of one embodiment of a 4-state inverter. The inverter has an input 401 and an output 402. The inverter has 4 4-state switches each switch being enabled by a different state of the control input. Two switches are identified with numerals in FIG. 4; switch 405 is enabled when the control input is in state 0, and switch 406 is enabled when the control input is in state 1. All control inputs of the 4 switches are provided with the signal on the inverter input 401. Each switch has a signal source at its input. Each signal source represents a different state of 4 states in this example. Two signal sources are identified with numerals; signal source 403 connected to the input of switch 405 provides a signal representing state 1, and signal source 404 connected to the input of switch 406, provides a signal representing state 3.

It is easy to see that if input 401 has state 0, then switch 405 is enabled and a signal representing state 3 is provided at the output 402. Based on the diagram, one may conclude that the inverter of FIG. 4 represents inverter [1 3 0 2].

Generally, multi-state signals are presented as multi-level signals. For instance, in U.S. Pat. No. 6,133,754, issued on Oct. 17, 2000 to Olson, discloses using a voltage to implement a state. An n-state switching system then would apply at least n different levels of a voltage (including the 0, or absence of signal).

Such a limitation of embodiment of signals is not applied herein. As one aspect of the present invention latches will be provided using signals that may be independent instances of a physical phenomenon. The aspect of using independent instances of a physical phenomenon to represent a plurality of states was disclosed by the inventor in earlier mentioned U.S. patent application Ser. No. 11/964,507. A first independent instance of a signal in a device is a signal that when combined with a second independent instance of a signal will not create a third independent instance of a signal. One example of this may be a device that is an optical fiber that can transmit light of different wavelengths. In general, inputting light of a first wavelength and light of a second wavelength into the fiber at the same time will not create light of a third wavelength in the fiber.

In another embodiment of the present invention, a state may be represented by the presence of a material as an independent instance (the presence of a specific material) of a physical phenomenon (the presence of a material).

In the usage of light with different wavelengths as different states one may modify for instance a connecting fiber by using non-linear means that may create cross products of two or more wavelengths. However, in such a non-linear device the signals are not independent instances (wavelength) of a physical phenomenon (light, or e.m. radiation).

Furthermore, the use of absence of signal as a logic state may sometimes create problems, especially in n-state switching. The advantage of using absence of signal as a logic state is that it comes seemingly for free. However, in some cases it may be advantageous to assign only the presence of a signal not equal to absence of signal to a logic state.

The use of inverters for memory latches is known in binary and in ternary cases as discussed, for instance, in cited U.S. Pat. No. 6,133,754. In those cases, the absence of signal is used as a state and states are represented by magnitude based or level dependent signals. U.S. Pat. No. 6,133,754 further limits disclosure and details to ternary latches and provides no details of 4-valued inverters.

Figure 5:
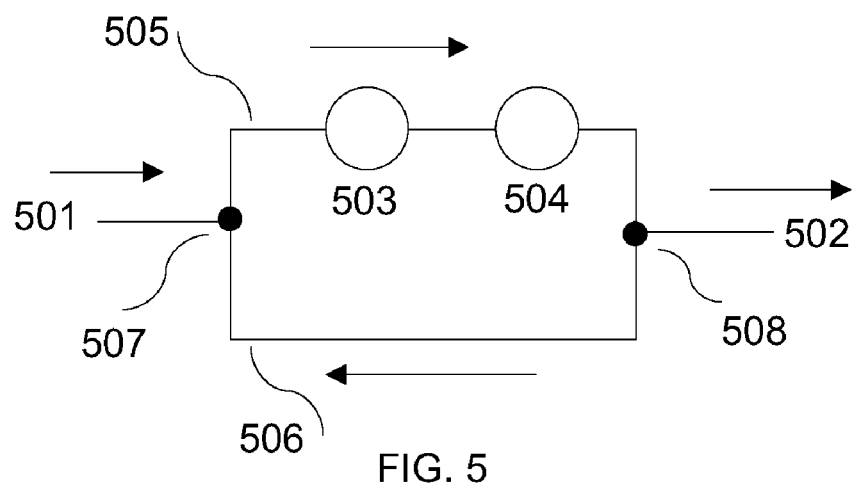
FIG. 5 is a diagram of an n-valued re-circulating information retaining device using inverters and a feedback path in accordance with an aspect of the present invention.
Figure 6:
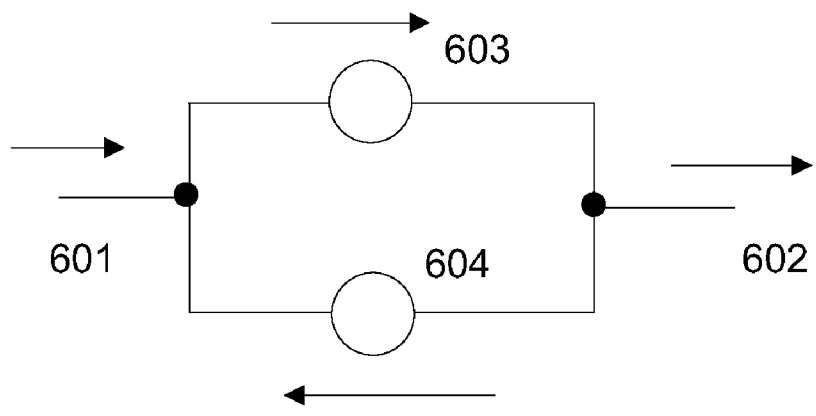
FIG. 6 is another diagram of an n-valued re-circulating information retaining device using inverters and a feedback path in accordance with an aspect of the present invention.
Figure 7:
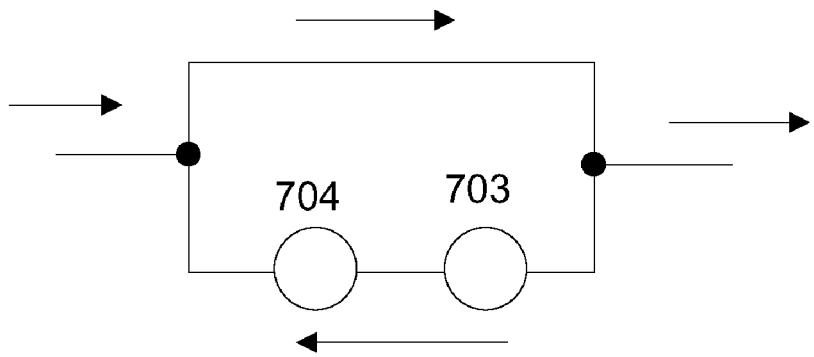
FIG. 7 is yet another diagram of an n-valued re-circulating information retaining device using inverters and a feedback path in accordance with an aspect of the present invention.

The use of inverters is usually in a re-circulating configuration as shown in FIGS. 5, 6 and 7. In FIG. 5 a signal representing a state is entered at input 501, goes through branch 505 of the circuit through inverters 503 and 504. An inverter as shown in FIGS. 5, 6, 7 and 8 such as 503 and 504 may be two or more inverters. Accordingly, 503 may be two inverters that will form one identity inverter. The same applies to 504. This allows providing an not inverted signal at the output 502.

The signal is outputted on output 502. However, part of it is also fed back through branch 506. This is achieved by a signal splitter 508. The feedback signal is combined by a signal combiner 507 with the signal at the input 501. Assuming that all inverters are causal systems and have a finite delay for processing a signal, clearly the signal going through both branches 505 and 506 will have a measurable delay.

Assume that at a certain point no signal is available on the input. The previous state of the signal still circulates inside the circuit. One would prefer in most cases that the signal on 502 is the same as it was at the input 501 and not an inverted version. The inverters 503 and 504 thus in most cases will form an identity inverter. This is not absolutely required. One may put an inverter at the output to recover the original signal if it is inverted.

The circuit of FIG. 5 shows the principle of a re-circulating latch, but is not complete. In case of a signal being not absence of signal the re-circulated signal will be added to the input signal. One may install a signal limiter, so that a 1 and a 1 will never exceed the signal equivalent with a 1. However, if the input signal goes to 0 and zero is represented by absence of signal then absence of signal will be added to the previous state (which is still re-circulating) and the signal in the latch will still represent a 1.

Accordingly, switches or gates are required, for instance working under a clock signal, to make sure that input signal and re-circulated signal will not be added.

FIG. 6 shows a re-circulating latch without required gates wherein the forward branch from input to output has at least two inverters 603 forming identity though only one symbol is shown and the feedback branch has also at least 2 inverters 604 forming identity represented by a single symbol. The configuration of FIG. 6 allows the signal outputted on output 602 to be identical to the signal on 601. It also makes sure that the feedback signal has the correct state to enable re-circulation. Inverters 603 and 604 may also be single inverters wherein 603 and 604 combined establish identity.

FIG. 7 shows a re-circulating latch without the required gates wherein the inverters 703 and 704 are placed in the feedback branch.

It is again pointed out that FIGS. 5, 6 and 7 show only part of the n-state latches, as required switches are missing. One may conclude that an n-state latch contains a loop between an input and an output, whereby the loop contains a forward path and a feedback path. Furthermore, the loop contains at least two n-state reversible inverters, wherein the at least two reversible inverters preferably create identity between the input of the first inverter and output of the at least second inverter. The following configurations are among the possible configurations:

1. A first inverter in the forward path and a second inverter in the feedback path;
2. Two inverters in the forward path, and no inverters in the feedback path;
3. Two inverters in the feedback path and no inverters in the forward path;
4. It may be required, for instance, because more delay is required in the total loop, that more inverters are used. One may do that by adding sets of two inverters either in the forward loop or in the feedback loop or in both wherein each set of inverters establishes identity. All inverters are reversible.

It is also possible to establish identity with an odd number of n-state inverters. For instance, in the ternary case applying [1 2 0] three times will create [0 1 2]. Applying in the 8-state case the inverter [6 7 0 1 2 3 4 5] once and [1 2 3 4 5 6 7 0] twice will create [0 1 2 3 4 5 6 7].

In general, magnitude based inverters having one state that will not be inverted, for instance in [2 1 0] the state 1, will not create a delay or a buffer and may make the latch unstable.

Further possible configurations are:

5. Three or more inverters in the forward path, and no inverters in the feedback path;
6. Three or more inverters in the forward path, and one inverter in the feedback path;
7. Three or more inverters in the forward path, and two or more inverters in the feedback path;
8. No inverter in the forward path and three or more inverters in the feedback path;
9. One inverter in the forward path and three or more inverters in the feedback path;
10. Two or more inverters in the forward path and three or more inverters in the feedback path;

All inverters in the above configurations are reversible.

Preferably, the output of the feedback path, which is connected as will be shown later, preferably via a switch to the input of the forward path, has the same state as the input of the forward path. This is not absolutely required if switches are fast enough and the loop is slow enough, but it will make the design easier to realize.

Figure 8:
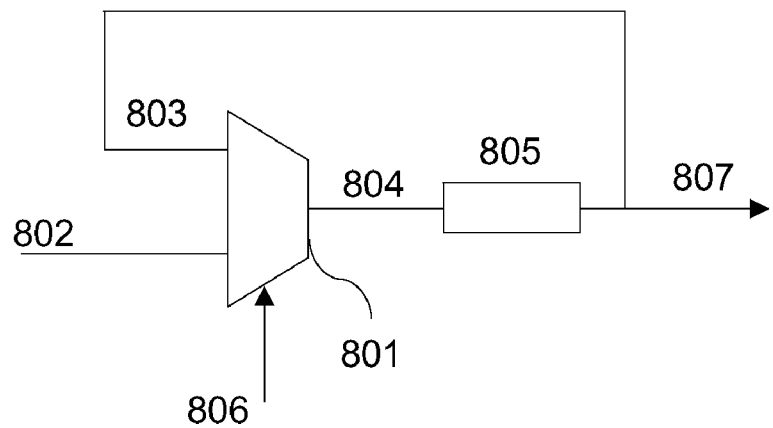
FIG. 8 is a diagram of an n-valued information retaining device with a feedback path using a multiplexer and an n-valued inverter in accordance with an aspect of the present invention.
Figure 9:
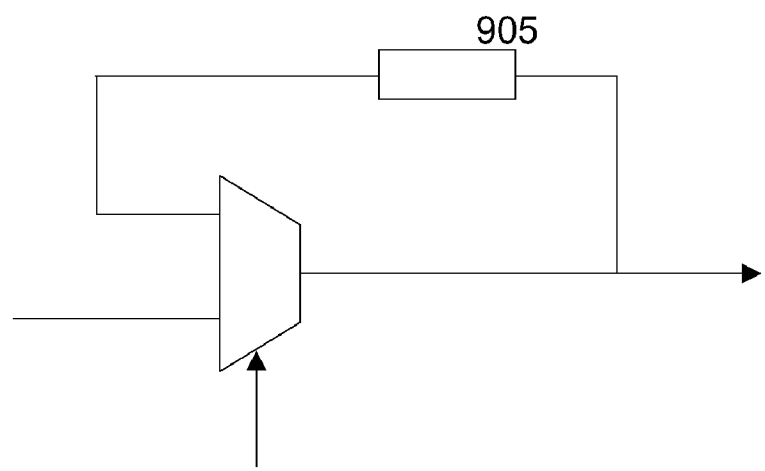
FIG. 9 is another diagram of an n-valued information retaining device with a feedback path using a multiplexer and an n-valued inverter in accordance with an aspect of the present invention.
Figure 10:
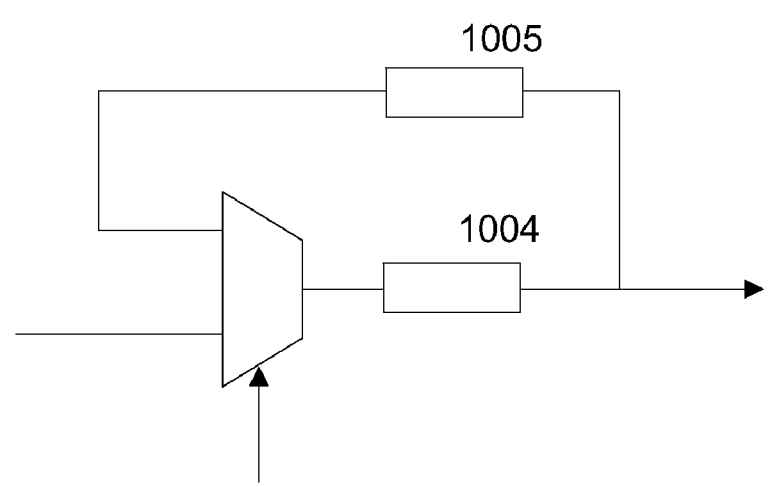
FIG. 10 is yet another diagram of an n-valued information retaining device with a feedback path using a multiplexer and an n-valued inverter in accordance with an aspect of the present invention.

FIGS. 8, 9 and 10 show illustrative embodiments of n-state latches using a multiplexer to select either an input signal or a feedback signal. The gating device is a multiplexer 801 with three inputs 802, 803 and 806 and an output 804. A binary or n-state signal is provided on input 802. A control signal, which may be a clock signal, is provided on input 806. The signal on 804, depending on the state of a signal on 806, represents either the state of input 802 or the state of input 803. The signal on the output 804 is processed by an inverter device 805, which may be an identity inverter. An identity inverter provides, at its output, a signal with the same state as at its input. While such a device 805 may not cause a change of state between input and output, it will create transformations internally, as it has in accordance with an aspect of the present invention at least two reversible inverters. Accordingly, it will create a finite delay between input and output signal. The device 805 outputs a signal on output 807 and has a feedback to input 803.

One may create embodiments which are variants of the configuration of FIG. 8. For instance, FIG. 9 is almost identical to FIG. 8 with the difference that the delaying inverter or inverter set is now 905 in the feedback loop. Another variation is shown in FIG. 10 wherein that both the output of the multiplexer and the feedback loop have an inverter or inverter set, 1004 and 1005 respectively, whereby each inverter set has at least one reversible inverter.

Figure 11:
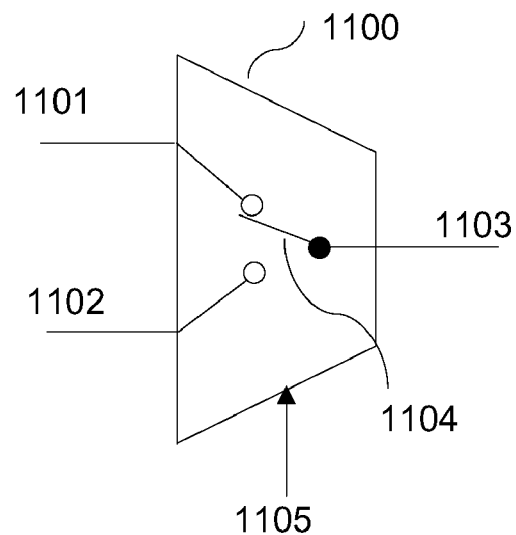
FIG. 11 is a diagram of an n-valued multiplexer.

There is a fundamental issue in the general multiplexer-with-feedback description. FIG. 11 shows a diagram of a multiplexer 1100 as generally used in explanations of multiplexers. This multiplexer has two inputs 1101 and 1102. More inputs are also possible. The output is 1103. A switch 1104, possibly under control of a clock or other signal inputted on 1105, switches an input to the output 1103. However, such a description is mechanical in nature and is usually not how an electronic multiplexer works in a re-circulating latch.

Figure 12:
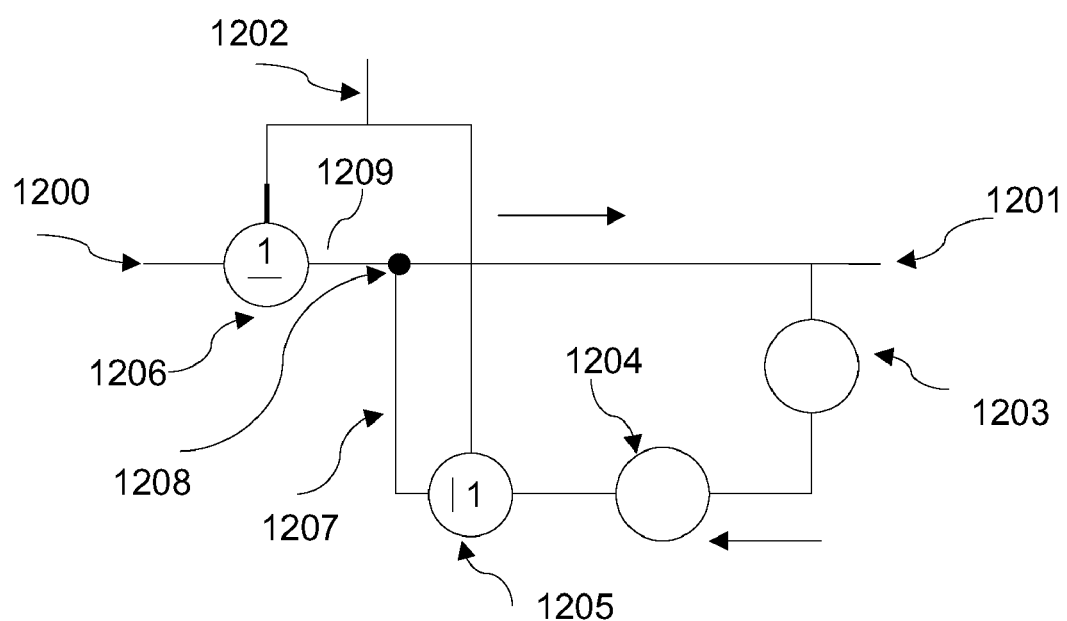
FIG. 12 is a diagram of an n-valued information retaining device with feedback.

An illustrative example of an implementation of a re-circulating latch is shown in FIG. 12. This latch has an input 1200 on which to be stored signal is inputted and an output 1201, two inverters (1203 and 1204), and two switches or gates (1205 and 1206). Furthermore, the gates are controlled by a signal inputted on 1202. Gate 1206 is conducting when the signal on 1202 has state 1 and gate 1205 is conducting when the signal on 1202 has not state 1. A feedback path connects to the forward path via a combining connection 1208.

Assume that the latch as shown in FIG. 12 is a 4-state latch wherein a state is represented by a magnitude based signal. Assume that absence of signal also represents a state. The inverters 1203 and 1204 can be the pair [3 0 1 2] and [1 2 3 0]. The inverters can also be self reversing and thus identical, for instance [3 2 1 0]. Another combination that will create identity is [2 0 3 1] and [1 3 0 2]. Furthermore, an inverter 1203 and 1204 can be more than 2 inverters as long as the combination of inverters creates identity. For instance, 1203 can be two inverters [2 0 3 1]. Inverting [0 1 2 3] twice with [2 0 3 1] will result in [3 2 1 0]. The state [3 2 1 0] can be inverted to [0 1 2 3] by applying inverter 1204 being [3 2 1 0].

In the earlier cited U.S. patent application Ser. No. 10/935, 960 it was shown by the inventor that an n-valued or n-state logic has 1×2×3× . . . ×n=n! reversible inverters including identity. Accordingly, a 4-state logic has 24 reversible inverters. A reversible inverter may be defined as an inverter with a signal in one of n states at its input and which is followed by its reversing inverter will always generate a signal at the output of the reversing inverter with a state identical to the state at the input of the reversible inverter. Or in other words: an inverter in serial with its reversing inverter will act as identity. Strictly speaking, an identity inverter is also a reversible inverter. Reversible inverters are used in latches to create a finite delay to allow the feedback mechanism to work.

The configuration of FIG. 12 has as result that in the ideal situation the new signal presented at 1208 through feedback loop 1207 has the same state as a just interrupted signal from input 1200 by gate 1206 at gate output 1209.

Figure 13:
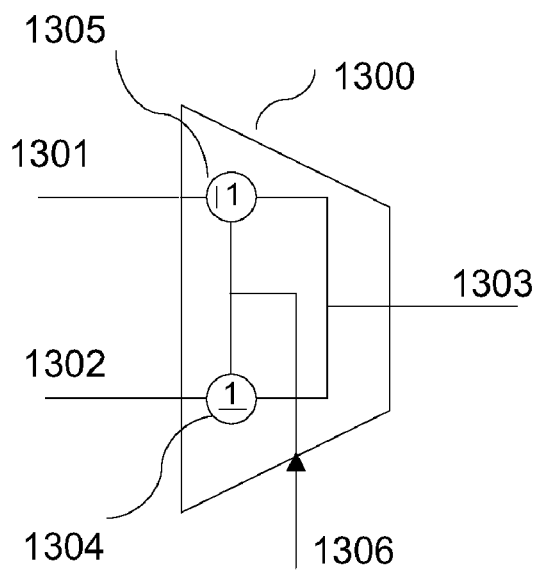
FIG. 13 is another diagram of an n-valued multiplexer.

In fact the multiplexer as used in FIG. 12 really should be shown in diagram as multiplexer 1300 FIG. 13 which switches either input 1301 or 1302 to output 1303 depending on the state of the control input 1306 which controls if gate 1304 or 1305 is conducting. Other configurations, for instance, using constant state signal generators which will be enabled based on input signals and control signals are also fully contemplated. While examples of gates may show state 1 as a conducting or non-conducting state, it is to be understood that this state is used as an illustrative example and that any other of n states may be used, particularly in the case wherein a signal is an independent instance of a physical phenomenon.

While examples have been shown of 4-state inverters latches with n-state inverters and feedback and gates as shown in FIG. 12 can be realized for n>4 also.

As an example of a 5-valued reversible inverter one may use [1 2 3 4 0] with its reversing inverter [4 0 1 2 3]. A 5-valued self reversing inverter is [4 1 3 2 0]. Another 5-valued reversible inverter is [3 4 1 2 0] with reversing inverter [4 2 3 0 1].

An 8-valued reversible inverter may be [3 4 5 6 7 0 1 2] with reversing inverter [5 6 7 0 1 2 3 4]. A self-reversing 8-valued inverter is [6 7 4 5 2 3 0 1].

Another type of reversible inverter is a universal inverter, which will create identity after being applied more than 2 times in the 8-state case. One such universal inverter is [1 2 3 4 5 6 7 0]. Each time this inverter is applied to the result of a previous inversion all elements in the inverter appear to shift one position, until identity is achieved.

Figure 14:
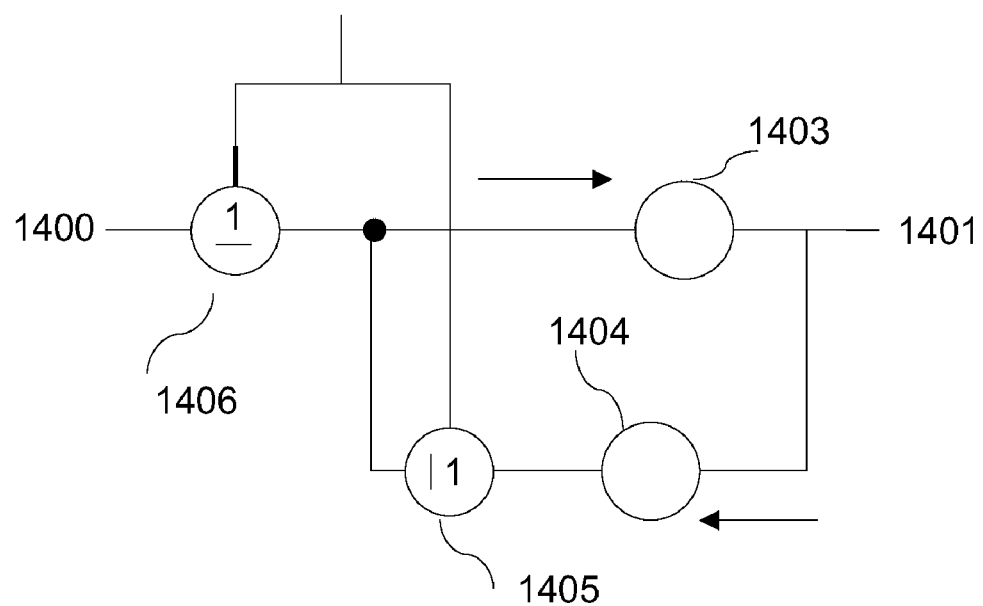
FIG. 14 is another diagram of an n-valued information retaining device with feedback.

The above shows that one may achieve identity as required in a latch such as an 8-state latch by using 2 or more reversible inverters. Such a latch may have a configuration as in FIG. 14. Herein, 1403 may be an inverter being identity from at least 2 reversible inverters. The same applies to 1404. One may also have a configuration wherein either 1403 or 1404 is a straight connection. The above assures that the same state is provided on the output 1401 as on the input 1400 of the latch with gate 1406 enabled; but also that the output 1401 has the 'saved' state provided through the feedback branch when gate 1405 is enabled.

One may actually use reversible inverters so that an output of the latch provides an inverted state of an input. In that case, an inverter has to be connected to the output to invert a state back to an input state.

Figure 15:
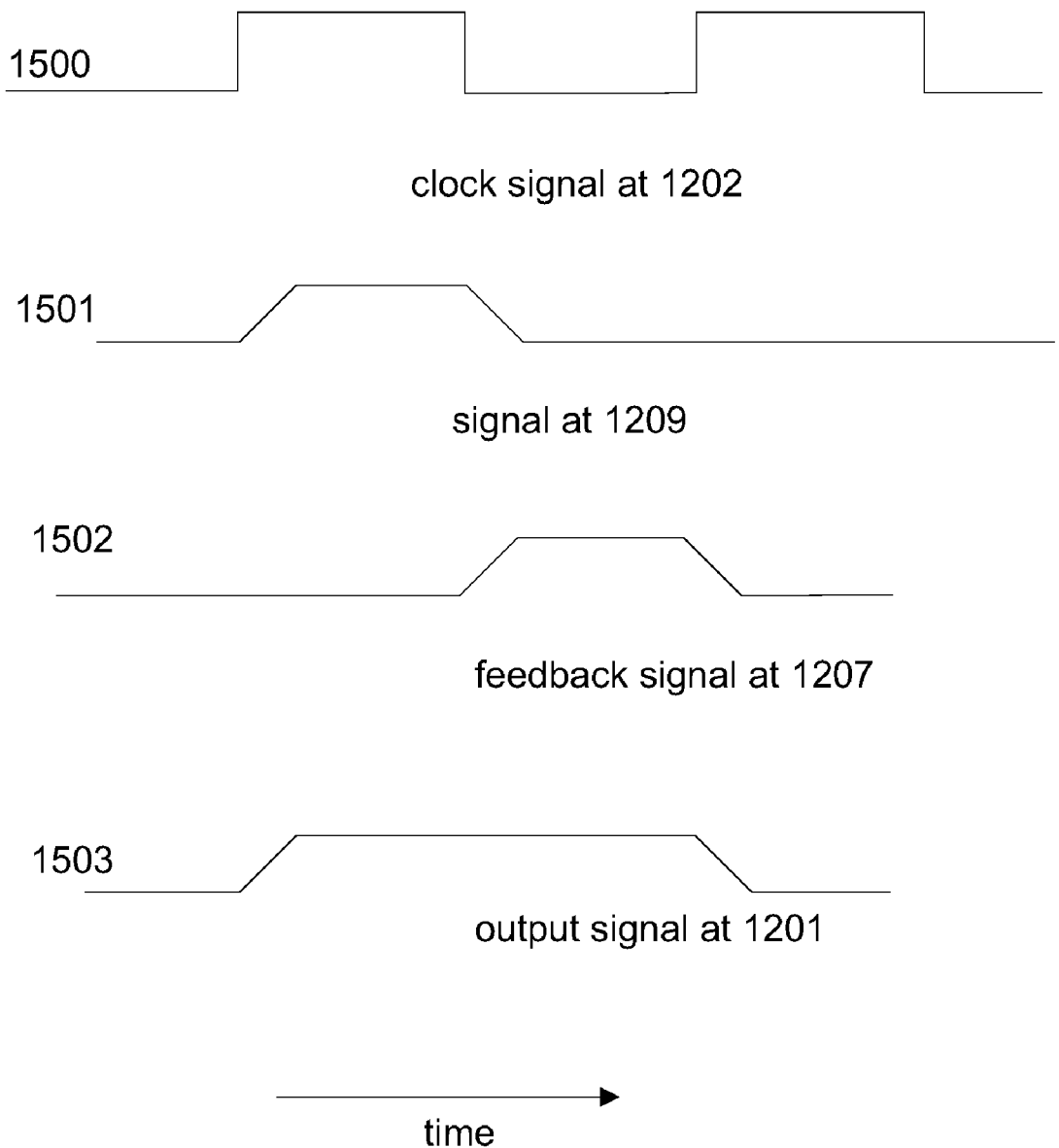
FIG. 15 is a timing diagram.

A potential source of problems may be the switching delay of the gates. Using the configuration of FIG. 12 one may draw a diagram of the signal amplitude as a function of time when the signals representing states are magnitude based. Assume for simplicity sake that gates 1206 and 1205 have the same switching behavior, but reversed in phase. The gate 1206 has as output 1209 and gate 125 has as output 1207. Both outputs are combined at 1208. A clock signal is provided on 1202 which is shown in FIG. 15 curve 1500. The input signal at 1200 that has to be latched and is available at 1209 after gate 1205 is shown in the curve 1501 in FIG. 15 designated input signal. One can see that the signal becomes available at 1209 after gate 1206 is enabled by the clock signal on 1202. When the clock signal becomes low the gate 1206 is disabled with some delay which is also shown in the curve 1501.

When the clock signal at 1202 becomes low gate 1205 is enabled and a signal becomes available with delay at 1209 in the feedback loop. This is shown in FIG. 15 curve 1502. It also shows the delay in gate 1205 becoming disabled.

The curve 1503 in FIG. 15 shows what happens at 1201. Because of the identical behavior of gates 1205 and 1206 the delay effects are canceled out.

This canceling effect may exist for any n-valued latch. In that case, using absence of signal for representing a state may not be a problem in the n-state latch with inverters in feedback configuration. However, a problem may exist when gate 1205 and 1206 open and close with different delays. In that case, the addition of the remainder of the diminishing signal at 1209 combined with the rising signal from 1207 may be added at 1208 to be different from the original input signal. In that case the input of 1203 sees a different signal than it had a moment before and it thus may start for instance an unstable situation in the latch which is undesirable.

In accordance with an aspect of the present invention, a state will be represented by an independent instance of a physical phenomenon. One illustrative example of such a physical phenomenon is light, and an independent instant of light is light of a specific wavelength. If one uses one linear independent connection and circuitry, then light of a first wavelength and light of a second wavelength may be added without creating light of a third wavelength. Adding of light of a first wavelength and light of a second wavelength will not change the signals of the first or the second wavelength, which will continue to exist independently of each other. These and other aspects of non-magnitude based representations of states are explained in U.S. patent application Ser. No. 11/964,507 which is incorporated herein by reference in its entirety.

Non-magnitude based signal herein does not mean that a signal does not have a magnitude, level, intensity or energy. In practice, for a signal to be detected a certain minimum level is of course required. In logic circuits the purpose is to distinguish between states of a signal. Commonly in binary signals this is based on distinguishing between magnitudes of signal. Coding using phase angle or pulse position are without further measures in essence level based or magnitude based as any linear addition of a signal may affect the correct detection. Assume one has, for instance, two signals, a signal of red light and a signal of green light within very well defined bandwidths and detectors that essentially only detects either red light or green light. Clearly, one has to have a sufficient amount of red light to be detected. However, above a certain level the level or intensity of red light does not matter for detection. Furthermore, no matter how intense the green light is a red light detector will not detect green light.

Another example may be wherein a state is represented by the presence of a material. It is well known that sensors or detectors exist that are very specific in detecting a certain material and will not react to the presence of a different material, no matter how concentrated that different material is.

Figure 16:
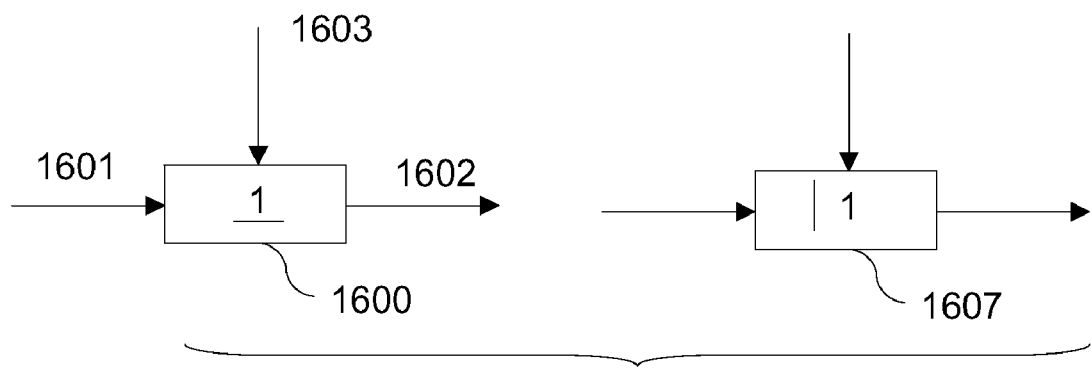
FIG. 16 is a diagram of an n-valued gating device in accordance with an aspect of the present invention.

Using the enablement from patent application Ser. No. 11/964,507 one may then apply the non-magnitude switch 1600 as shown in FIG. 16. It has an input 1601 and output 1602 and a control input 1603. The meaning of this switch is the following: a signal being an independent instance of a physical phenomenon representing a first on n states may be inputted on input 1601. Whenever an independent instance of a physical phenomenon representing a second of n states is provided on control input 1603 the output 1602 will present an independent instance of a physical phenomenon representing the state of the signal provided on input 1601. Whenever an independent instance of a physical phenomenon not representing a second of n states is provided on control input 1603 the output 1602 will provide a signal equivalent to absence of signal at input 1601. N may be greater than 1, covering the binary and higher cases. N may also be greater than 2, covering the ternary and higher cases. A variation of 1600 is 1607 wherein the gate is enabled when the control input is not in a state 1. It should be clear that the control state in the gates of FIG. 16 can be any of n states and that the state 1 is merely provided as an illustrative example. It should also be clear that the control signal may be a binary signal, having two states. The control signal may be two independent signals not including absence of signal it may also be a single signal that includes absence of signal as a state.

For illustrative purposes, the physical phenomenon may be considered to be light with as independent instance the wavelength of light. Other phenomena may be electrical signals of a certain frequency, or presence of a material or any other physical phenomenon that can appear in at least two independent instances.

The switch in FIG. 16 has at least two embodiments. The first embodiment is wherein absence of signal represents a state. The second embodiment is wherein absence of signal does not represent a state.

Figure 17:
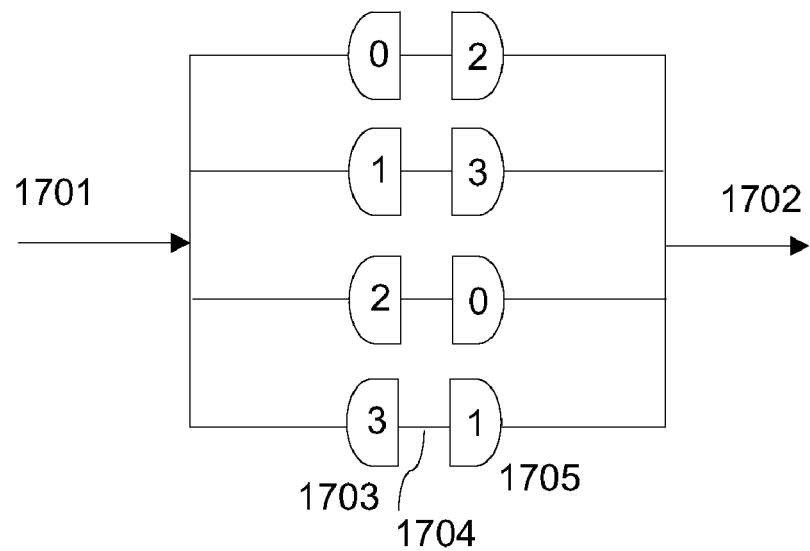
FIG. 17 is a diagram of an n-valued inverter in accordance with an aspect of the present invention.

FIG. 17 shows an illustrative example in diagram of a 4-valued inverter, using non-magnitude based signals. The working of an element of an inverter will be briefly explained. The inverter of FIG. 17 has 4 channels between input 1701 and output 1702, wherein each channel handles one of 4 possible input states. It is fairly easy to see that the inverter is the 4-valued inverter [2 3 0 1]. The bottom channel of the inverter converts input state 3 to an output state 1. Assume, for illustrative purposes, that the signals are light signals with different wavelengths. The bottom channel has a light detector 1703, for instance with a narrow filter that will pass light representing state 3, but will stop light that represents states 0, 1 and 2. Assume that a light signal representing state 3 is available on input 1701. Only detector 1703 will detect the presence of this signal. In one embodiment the detector 1703 may generate a detection signal on 1704. This detection signal may enable a signal generator 1705, which may be a light source generating a light signal with a wavelength that represents a state 1. Accordingly one may thus create any n-valued inverter. Furthermore, the state 0 is also represented by a signal not being absence-of-signal. Absence-of signal in this embodiment does not represent a logic state.

Figure 18:
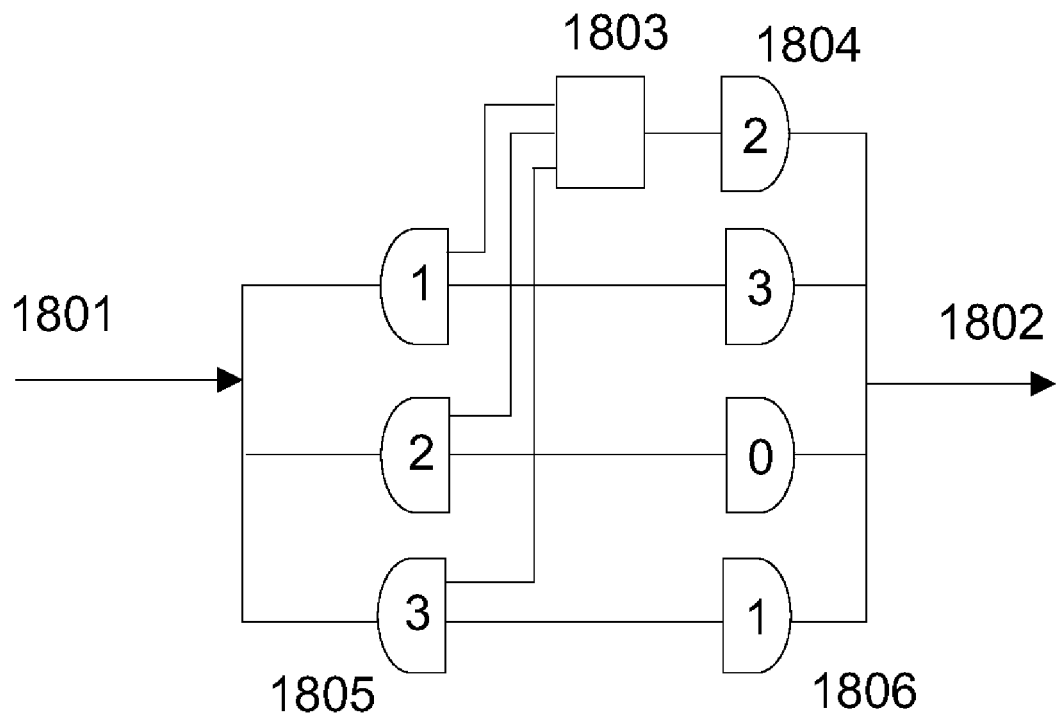
FIG. 18 is a diagram of an n-valued inverter in accordance with another aspect of the present invention.

FIG. 18 shows an inverter with the same functionality as FIG. 17 and using non-magnitude based signals, but with using absence-of-signal as a switching or logic state (0 in the example). This means that a circuit always generates a state. Accordingly, absence-of-signal has to be always detected. FIG. 18 shows an inverter with input 1801 and output 1802. A signal with state 3 will be detected by detector 1805 which will enable signal generator 1806 to generate a signal representing state 1. One may install a detector which detects absence-of-signal. As an illustrative example, such a detector is 1803. Detector 1803 gets a detection signal from detectors for states 1, 2 and 3. If none of these states are detected then 1803 generates a signal that will enable signal generator to generate a signal representing state 2, which will be outputted on output 1802.

It should be apparent that configurations of FIG. 17 and FIG. 18 can also be used for generating magnitude based signals and those configurations are fully contemplated.

Figure 19:
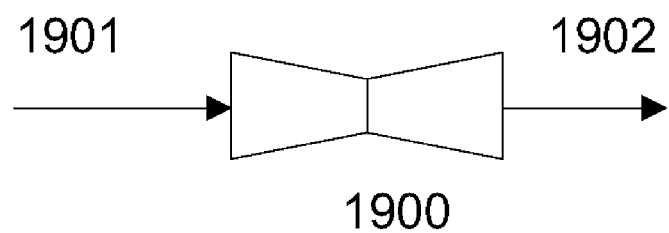
FIG. 19 is a diagram representing an n-valued inverter in accordance with an aspect of the present invention.

FIG. 19 shows a diagram for a binary and n-valued inverter which can apply non-magnitude based signals. It is to be understood that non-magnitude signals are meant to be distinguished from other non-magnitude based signals. Accordingly, these signals will have a certain minimum magnitude to be detected. However, the magnitude beyond some measure to be detected above a potential noise level has no significance of differentiating between two different signals. A signal x will be detected no matter if it has a magnitude a.x or b.x, as long the magnitude is above a detectable minimum. That may have as a consequence that a signal a.x may be detected as a state p, a signal b.x may also be detected as a state p, and also (a.x+b.x) or (a.x−b.x) will be detected as a state p, as long as the signals are above a detectable minimum.

The last property is important in the multiplexer based latches wherein finite switching times play a role. An n-valued latch using gates and inverters which may be based on magnitude based as well as non-magnitude based signals is provided in FIG. 20. The latch has inputs 2000 and 2002 of which 2002 is a control input of gates 2006 and 2005; the latch has an output 2001 and it has in one embodiment n-valued inverters 2003 and 2004. Inverters 2003 and 2004 may be composite (2 or more) inverters as long as 2003 and 2004 both achieve identity. In another embodiment, either 2003 or 2004 may be replaced by a plain connection not having any delay comparable to an inverter. In yet another embodiment either 2003 or 2004 may not be identity. In that case one of the two inverters preferably is a plain connection. However in a further embodiment 2003 and 2004 may each implement reversible inverters not being identity so that 2003 and 2004 combined establish identity. In that case for correct representation of the input state at an output one must use a reversing inverter to revert back to the input state.

The gate 2006 has an output 2009; the feedback signal goes through a loop 2007 and the output 2009 and loop 2007 are combined in node 2008. This is a universal latch for n≧2. One may say that the latch has a forward path from 2008 as input to 2001 as output; and a feedback path from 2001 as input to 2008 as output through a path 2007. The feedback path and forward path are combined in 2008. The feedback path may be interrupted by an individually controlled gate. The combined path formed by a forward path and a feedback path must contain at least one n-valued reversible inverter. Preferably, the combined path has two or more reversible inverters establishing identity. Each reversible inverter has a finite delay in transforming input state to output state. Preferably, if the forward path and/or the feedback path have a reversible inverter they should be at least two reversible inverters establishing identity. The inverters should be dimensioned preferably in such a way that the output of the feedback path and the input of the forward path if there would be no interruptions in the paths will have the same state.

Figure 20:
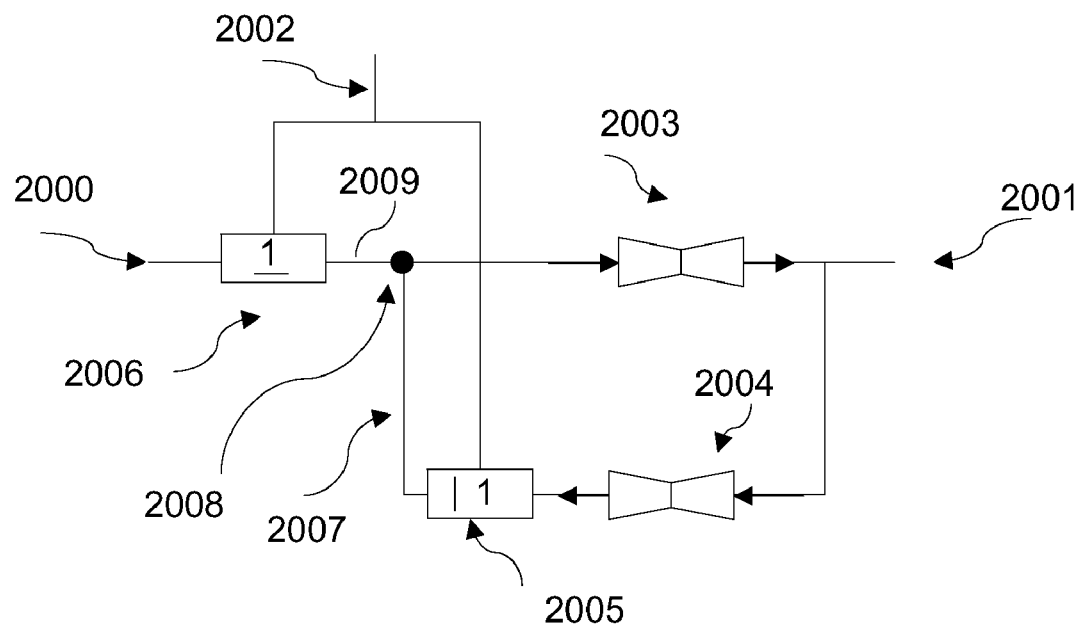
FIG. 20 is a diagram of an n-valued re-circulating latch in accordance with an aspect of the present invention.

The latch of FIG. 20 then works for n=2 or binary latches and for n>2 or non-binary latches, for n>3 and for n>5. It also works for magnitude based or level-based signals and for non-magnitude based signals. Furthermore, the latch of FIG. 20 works for situations wherein absence-of-signal represents a state and also when absence-of-signal does not represent a state. Also 2003 may be a straight through connection, with 2004 being at least 2 reversible inverters which may establish identity; 2004 may be a straight through connection, with 2003 being at least 2 reversible inverters which may establish identity; and 2003 and 2004 may each be at least one inverter with 2003 and 2004 combined establish identity.

Figure 21:
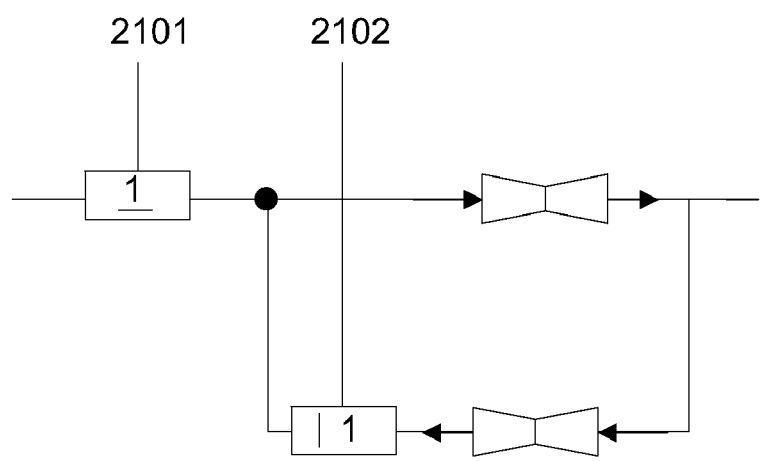
FIG. 21 is a diagram of an n-valued re-circulating latch in accordance with another aspect of the present invention.

Gates 2005 and 2006 have a common input 2002 to indicate that the gates should be enabled on opposite moments. For timing purposes it may be beneficial that a slight delay exist between disabling the one gate and enabling the other one. In that case one may replace the one common input by two separate inputs as shown in FIG. 21 with separate control inputs 2101 and 2102 for the gates.

In accordance with a further aspect of the present invention, a re-circulating latch with inverters and one gate is provided. A diagram of such a latch which can be binary or it can be an n-valued latch with n>2 is provided in FIG. 22. Such a latch looks somewhat like a latch in, for instance, FIG. 20 or 21. However one gate has been removed. The latch in FIG. 22 has an input 2201 on which to be saved state is provided, and an output 2202 which will provide the saved or current state. Two inverters 2205 and 2206 are provided; inverter 2205 being in the forward path and 2206 in the feedback path. The same conditions and possible inverter configurations as described previously apply here. The difference is that only one gate 2203 with a control input 2204 is provided. This gate is in the feedback path and can interrupt the path. The gate has an input 2208 and an output 2209. This gate has the performance of: the output 2209 provides a signal representing the same state as the signal at input 2208 of the gate whenever control input 2204 has absence of signal. Whenever control input 2204 has not absence of signal then output 2209 has absence of signal.

This leads to the following situation: whenever input 2201 has a signal representing a state not being absence of signal output 2209 has absence of signal. At combination point 2207 only a signal inputted on 2201 will be provided and will be inverted by inverter 2205. Inverter 2205 is either a straight through connection (in that case 2206 is at least 2 inverters realizing identity), or 2205 are 2 inverters realizing identity. The signal is outputted on 2202 and returned through the feedback path with inverter 2206. The inverter 2206 may be a straight through connection if 2205 is an inverter or combination of inverters; if 2205 is a connection then 2206 should be one or more inverters (having a finite delay) realizing identity. Because the signal on 2201 is not absence of signal the output 2209 of gate 2203 is absence of signal. Assume the signal on 2201 changes from a signal to an absence of signal. This means that the output 2209 of gate 2203 provides a signal that has the state of the earlier signal at 2201.

When one applies signals for n=2 and for n>2 which represent a state and are non-magnitude based signals then the system is less sensitive to timing issues. For instance, it may be that both 2201 and 2209 provide a signal as 2201 is fading and 2209 is rising. Because these are non-magnitude based signals they still represent the same state and no other state will be generated. To prevent saturation effects one may provide a signal limiter before the inverter 2205. However, no change of state will happen. It may also be that the signal disappears faster from 2201 than it appears at the output 2209 due to switching delays. Assuming that switching still takes place within the finite delay time of the inverters there will be a signal representing the correct state at 2208 before the signal fades completely. Though there may be a dip in signal strength possibly for a small period of time below detectable levels, for instance when inverter 2205 receives no signal at its input and inverter 2206 receives and responds to a signal from the output of inverter 2205, eventually the correct signal will be generated. This configuration is robust when absence of signal does not represent a state.

Furthermore, means 2208 for preventing input 2201 having the same state as 2207 may be required. Such means may be a diode in case of a state being represented by a voltage. It may be, for instance, a one way mirror type with a broad bandwidth in the optical case. It may also be an individually controlled gate with the control input connected to 2201.

When absence of signal represents a state then inverter 2205 may respond to a state represented by absence of signal while shortly thereafter also responding to a signal not being absence of signal. Unless other measures are taken, the latch will now have two or even more states represented at the output, which for at least a latch function may be undesirable.

Magnitude based signals in the above situations may also create problems because 2208 may have a signal level that does not represent the correct state in an n-valued situation.

Figure 22:
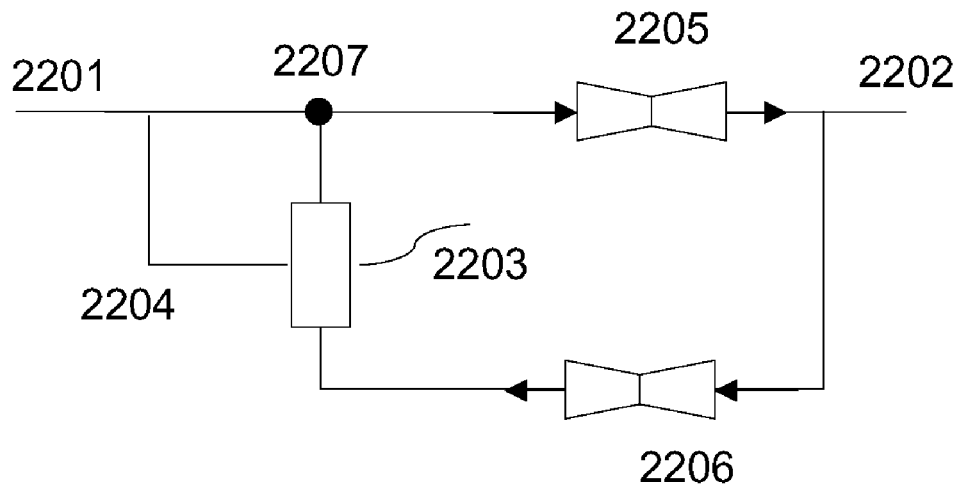
FIG. 22 is a diagram of an n-valued re-circulating latch in accordance with yet another aspect of the present invention.

The latch configuration of FIG. 22 allows for asynchronous use. When the signal on the input disappears it is automatically stored in the latch and provided at the output. When a signal appears it is provided on the output and the latch is readied for storage again. One can, of course, make this latch being under control of a clock signal by inserting an individually controlled gate controlled by a clock signal at the input 2201.

Figure 23:
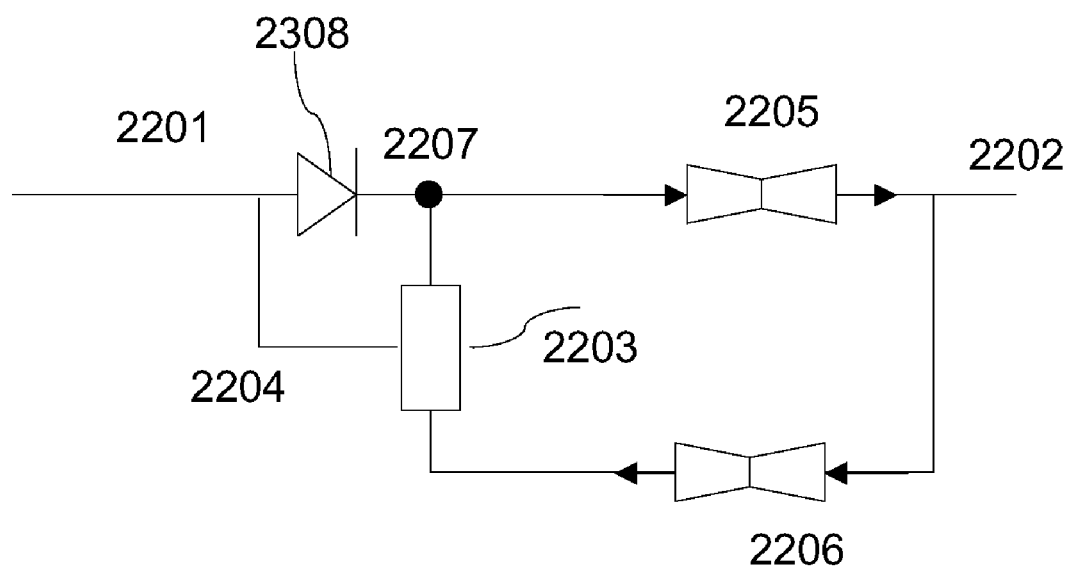
FIG. 23 is a diagram of an n-valued re-circulating latch in accordance with yet another aspect of the present invention.

FIG. 22 shows a principle of an asynchronous embodiment of a re-circulating latch. In the electrical case input 2201 will normally assume the potential of 2207 and accordingly 2204 will assume the potential of 2207. This is, of course, not desirable. A solution is shown in FIG. 23. Identical numerals in FIG. 22 and FIG. 23 indicate identical functions and devices. To separate 2201 from 2207 a separator 2308 is provided. In direct current situations such as separator 2308 may be a diode as is shown in FIG. 23. In the optical case a separator may be a mirror type solution that allows light coming from 2201 to pass to 2207 but stops flush-back from 2207 to 2201.

One may replace the term "absence of signal" with the term "a signal representing absence of state" which may include "absence-of-signal". For certain reasons, for instance to check if a circuit is still operational, one may provide a signal that does not represent a state being one of n states. In that sense, an (n+1)th instance of a phenomenon or a (n+1)th level or magnitude of a signal act upon a switch or an inverter as a non-state. As shown before, absence-of-signal may represent a state, in that case absence-of-signal is considered to be a signal representing a state.

Figure 24:
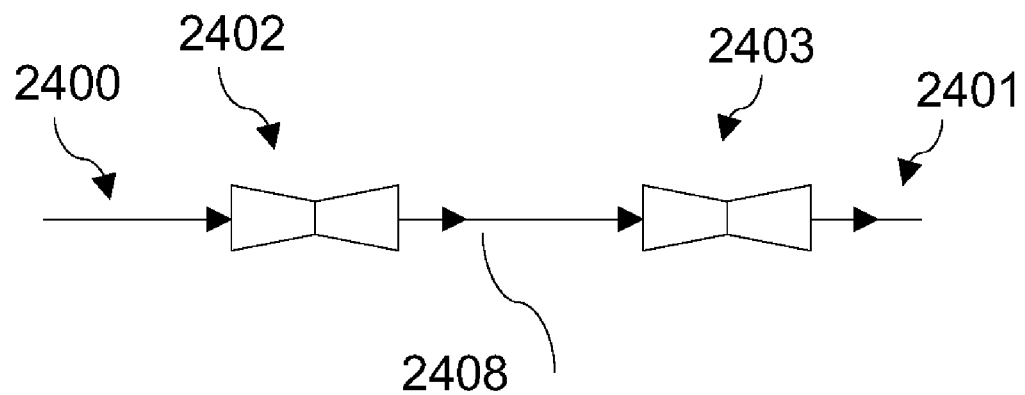
FIG. 24 shows a diagram of a combination of n-valued inverters in accordance with an aspect of the present invention.
Figure 25:
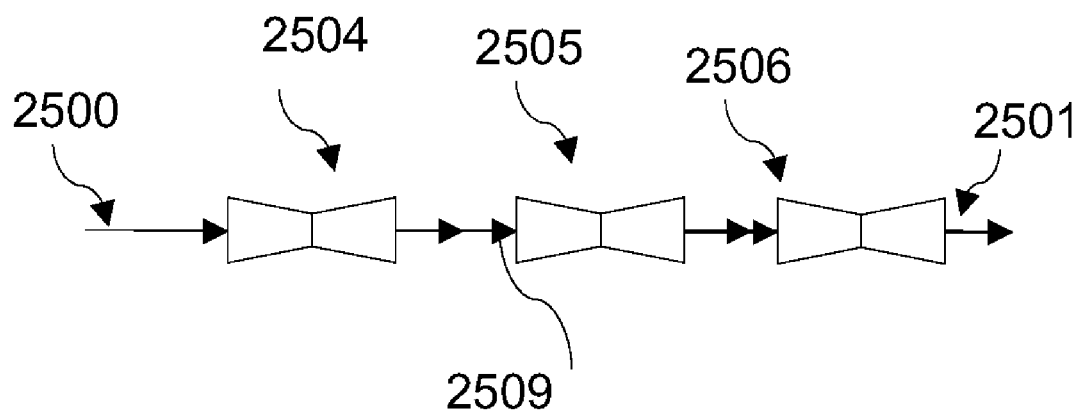
FIG. 25 shows a diagram of another combination of n-valued inverters in accordance with an aspect of the present invention.

The concept of multiple n-valued inverters creating identity or an identity inverter is illustrated in FIGS. 24 and 25. When two inverters do not create sufficient delay one may create a combination of two or more n-valued inverters to create additional delay in a path. The paths shown in FIGS. 24 and 25 may be a complete re-re-circulating path for a latch without required switches. In FIG. 24 a first series of inverters with input 2400 and output 2401 is shown in a path 2408. The n-valued reversible inverters 2402 and 2403 will be selected in such a way that the state of the n-valued signal on 2401 is identical to the state of the signal on 2400. While usually one will create a path that is implemented in a single physical phenomenon, this is not really required. For instance, one may start with a signal on 2400 that is for instance an electronic signal with a certain frequency that represents a state p out of n possible states. The signal provided on 2401 may be an optical signal that also represents state p out of n states. Such conversions are known. For instance, one may convert an n-valued signal to a plurality of m-valued signals by using A/D converters.

For instance, reversible inverters 2402 and 2403 may be 4-valued inverters. For instance inverter 2402 may be a self reversing 4-valued inverter such as [2 3 0 1] and inverter 2403 is also [2 3 0 1]. Applying inverter 2402 to [0 1 2 3] provides of course [2 3 0 1]. Applying [2 3 0 1] to [2 3 01] provides [0 1 2 3]. Accordingly, the states of input 2400 and output 2401 are identical. One may also make inverter 2402 [1 2 3 0] which is a universal inverter. Repeating this inverter 4 times will create again [0 1 2 3]. However in this case identity has to be achieved in 2 steps. Accordingly, when inverter 2402 is [1 2 3 0] then inverter 2403 has to be [3 0 1 2]. There are 24 reversible 4-valued inverters and each inverter can be reversed. An example not using self-reversing inverters, nor universal inverters is inverter 2402 being [1 3 0 2] and inverter 2403 being [2 0 3 1].

One may also create 8-valued inverters. There are 8!=40, 320 8-valued reversible inverters. One example is a self reversing 8-valued inverter for instance [7 6 5 4 3 2 1 0] for both inverters 2402 and 2403. Applying the inverter twice will generate [0 1 2 3 4 5 6 7]. One may also select a universal 8-valued inverter for inverter 2402 for instance [1 2 3 4 5 6 7 0]. The reversing inverter 2403 for inverter 2402 is then [7 0 1 2 3 4 5 6]. A set of 8-state inverters being neither self-reversing nor universal establishing identity is 2402 being [7 3 0 5 2 6 1 4] and inverter 2403 being [2 6 4 1 7 3 5 0].

It should be clear that there are many combinations possible in the 8-valued case. The number of reversible inverters increases with n. Each n-valued logic has self-reversing inverters and universal inverters. Also, each n-valued logic has at least p reversible inverters not being identity inverters which when combined will achieve identity, with p≧2 and also with p>2. Identity means that whenever an input of an identity inverter has a first state being one and any of n states, an output of the identity inverter will also have the first state. An n-valued universal reversible inverter is an inverter when applied n times, starting with a first input with an input state and using the output as the next input, will create the original input state.

In FIG. 25 for the path 2509 a combination of 3 n-valued inverters 2504, 2505 and 2506 is required to form an identity inverter. A 4-valued example would be inverters 2504 and 2505 being the universal inverter [1 2 3 0]. This will create [2 3 0 1]. The inverter 2506 then has to be [2 3 0 1] to create identity. A similar example can be provided for the 8-valued case. When inverters 2504 and 2505 are both [1 2 3 4 5 6 7 0]then the equivalence is [2 3 4 5 6 7 0 1]. To create identity, inverter 2506 has to be [6 7 0 1 2 3 4 5]. These are all universal inverters.

As an example, one may also provide inverters which are neither self reversing nor universal. For instance, inverter 2504 can be [3 4 5 6 0 7 2 1] and inverter 2505 can be [6 3 0 1 7 5 2 4]. The result of inverting [0 1 2 3 4 5 6 7] is then [1 7 5 2 6 4 0 3]. This dictates that inverter 2506 has to be [6 0 3 7 5 2 4 1] in order to achieve identity of the combination.

The latches provided herein can be used in digital systems including but not limited to computers, computing systems, computing devices, data transmission systems, data storage systems, telephones including mobile phones, consumer electronic devices including audio and/or video devices, control systems including industrial control systems or any other system that can use digital storage devices.

The devices herein can be implemented by electronic, optical, electro-optical, nano-electronic, quantum-mechanical, mechanical, magnetic, mechanical, chemical, biochemical or any physical phenomenon or combination of physical phenomena that can be used to implement n-valued individually controlled gates, n-valued inverters and signals.

The latches herein provided as an aspect of the present invention can be applied in memory devices. In accordance with a further aspect of the present invention, apparatus are provided that contain one or more of the latches provided herein. Such an apparatus may be a computing device which is enabled to processes digital symbols such as multi-valued symbols stored in a latch. It may also process other digital symbols such as binary symbols that are at least at one stage stored as multi-valued symbols. Such a computing device may be a computer, a communication device, a mobile communication device, a mobile computing device, a data storage and/or retrieval device or any other device that is enabled to apply a multi-valued symbol stored in a multi-valued or multi-state latch. In accordance with the present invention, also systems are provided that comprise at least two devices which may be located at different locations, of which at least one is enabled to store an n-state symbols in a latch provided herein. Such a system may be a computer system, such as a distributed computer system; it may also be a communication system including as a wireless communication system; and the system may also be a data storage system. A system may also be a control system, being an apparatus or a system having different devices, apparatus or sub-systems enabled to perform a task which is controlled by a processor and applying data that is stored at least in part as n-state symbols in a latch as provided herein.

In one embodiment, an n-state reversible inverter may be implemented in binary form and wherein a word or a plurality of binary symbols is treated and processed as an n-state symbol.

In accordance with a further aspect of the present invention, binary latches can also be implemented by using independent instances of a physical phenomenon wherein absence of signal is not a state. This means that each of the two binary states is represented by a measurable signal. In another embodiment, each of a state in a binary latch may be represented by one of two levels or intensities of a physical phenomenon, not being absence of signal.

In view of the above description of the present invention, it will be appreciated by those skilled in the art that many variations, modifications and changes can be made to the present invention without departing from the spirit or scope of the present invention as defined by the claims appended hereto. All such variations, modifications or changes are fully contemplated by the present invention. While the invention has been described with reference to an illustrative embodiment, this description is not intended to be construed in a limiting sense.

It is also understood that the application of the present invention is focused on creating stable output signals as a result of applied n-valued switching mechanisms. It should be clear to those skilled in the art that the conditions and requirements can be changed in such a way that the circuits of the present invention will never become stable and may therefore have a useful application as a multi-valued signal generator or multi-vibrator.

The following patent applications, including the specifications, claims and drawings, are hereby incorporated by reference herein, as if they were fully set forth herein: (1) U.S. Provisional Patent Application No. 60/575,948, filed on Jun. 1, 2004, entitled MULTI-VALUE CODING OF SEQUENCES AND MULTI-VALUE MEMORY DEVICES; (2) U.S. Provisional Patent Application No. 60/599,781, filed Aug. 7, 2004, entitled MULTI-VALUED DIGITAL INFORMATION RETAINING ELEMENTS AND MEMORY DEVICES. (3) U.S. Non-Provisional patent application Ser. No. 10/935,960, filed on Sep. 8, 2004, entitled TERNARY AND MULTI-VALUE DIGITAL SCRAMBLERS, DESCRAMBLERS AND SEQUENCE GENERATORS; (4) U.S. Non-Provisional patent application Ser. No. 11/000,218, filed Nov. 30, 2004, now U.S. Pat. No. 7,218,144 entitled SINGLE AND COMPOSITE BINARY AND MULTI-VALUED LOGIC FUNCTIONS FROM GATES AND INVERTERS; (5) U.S. patent application Ser. No. 11/964,507, filed on Dec. 26, 2007, entitled IMPLEMENTING LOGIC FUNCTIONS WITH NON-MAGNITUDE BASED PHYSICAL PHENOMENA.

The invention claimed is:

1. An n-state data latching circuit comprising:
an n-state latch circuit with n>4 implementing along a signal path an identity n-state inverter, the latch circuit including an n-state input signal and an n-state output signal and that is responsive to a control signal so that the n-state output signal tracks the n-state input signal when the control signal is in a first state and latches the n-state output signal when the control signal is not in a first state.

2. The n-state data latching circuit as claimed in claim 1, further comprising an n-state multiplexer.

3. The n-state data latching circuit as claimed in claim 1, wherein an n-state signal is an independent instance of a physical phenomenon.

4. The n-state data latching circuit as claimed in claim 3, wherein the phenomenon is light.

5. The n-state data latching circuit as claimed in claim 1, wherein an n-state inverter is a self-reversing inverter.

6. The n-state data latching circuit as claimed in claim 1, wherein an n-state inverter is a universal inverter.

7. The n-state data latching circuit as claimed in claim 1, further comprising at least one n-state inverter not being a standard n-state inverter, the standard n-state inverter being defined by a formula $y=(n-1)-x$, with y being an output state of the n-state inverter as a result of an input state x with x>3.

8. The n-state data latching circuit as claimed in claim 1, wherein the storage device is part of a communication system.

9. An n-state memory latch comprising:
an n-state latch circuit with n>3 implementing along a signal path an identity n-state inverter, the latch circuit including an input enabled to receive an n-state input signal and an output to provide an n-state output signal so that the n-state output signal tracks the n-state input signal when the n-state signal is received at the input and latches the n-state output signal when no n-state signal is present at the input; and
the latch circuit containing at least one reversible n-state inverter not being a standard n-state inverter, a standard n-state inverter being defined by a formula $y=(n-1)-x$, with y being an output state of the n-state inverter as a result of an input state x with x>3.

10. The n-state memory latch as claimed in claim 9, wherein the n-state latch is part of a computing device.

11. The n-state memory latch as claimed in claim 9, wherein a signal is an independent instance of a physical phenomenon.

12. The n-state memory latch as claimed in claim 9, wherein the n-state memory latch is part of a computing device.

13. The n-state memory latch as claimed in claim 9, the n-state latch circuit further containing a controlled gate which completes or interrupts the signal path.

14. An n-state memory latch comprising:
an n-state latch circuit with n>4 implementing along a signal path an identity n-state inverter, the latch circuit including an input enabled to receive an n-state input signal and an output to provide an n-state output signal so that the n-state output signal tracks the n-state input signal when the n-state input signal is received at the input and latches the n-state output signal when no n-state input signal is present at the input.

15. The n-state memory latch of claim 14, wherein the n-state latch circuit is responsive to a control signal so that the n-state output signal tracks the n-state input signal when the control signal is in a first state and latches the n-state output signal when the control signal is not in a first state.

16. The n-state memory latch of claim 14, wherein a signal is an independent instance of a physical phenomenon.

17. The n-state memory latch of claim 14, further comprising:
at least two n-state inverters establishing identity.

18. The n-state memory latch of claim 14, wherein the latch is part of a computing device.

19. The n-state memory latch of claim 14, wherein the latch is part of a communication system.

20. The n-state memory latch of claim 14, wherein the latch is part of a video system.

* * * * *